United States Patent
Holdren, II et al.

(10) Patent No.: US 6,207,265 B1
(45) Date of Patent: Mar. 27, 2001

(54) NON-IONIC CIRCUIT BOARD MASKING AGENT

(75) Inventors: John W. Holdren, II, Marietta; Eric Martini, Smyrna, both of GA (US)

(73) Assignee: Illinois Tool Works Inc., Chicago, IL (US)

( * ) Notice: Subject to any disclaimer, the term of this patent is extended or adjusted under 35 U.S.C. 154(b) by 0 days.

(21) Appl. No.: 09/405,723

(22) Filed: Sep. 24, 1999

(51) Int. Cl.⁷ .................... B32B 5/14; C08J 89/06
(52) U.S. Cl. ............... 428/308.8; 524/13; 524/14; 524/25; 524/27; 524/35; 524/47; 524/55; 524/56; 524/77; 524/221; 524/500; 524/502; 524/503; 524/510; 428/319.3; 428/534; 428/535; 428/537.1; 428/901
(58) Field of Search ................... 524/13, 14, 25, 524/27, 35, 47, 55, 56, 77, 221, 500, 502, 503, 510; 428/308.8, 319.3, 537.1, 534, 535, 901

(56) References Cited

U.S. PATENT DOCUMENTS

| | | |
|---|---|---|
| 3,773,704 | 11/1973 | Hall et al. . |
| 4,378,384 | 3/1983 | Murakami et al. . |
| 4,973,420 * | 11/1990 | Van De Mark ............... 252/170 |
| 5,057,179 * | 10/1991 | DuLaney et al. ............. 156/280 |
| 5,302,413 | 4/1994 | Woodball et al. . |
| 5,420,171 | 5/1995 | Unruh . |
| 5,427,856 * | 6/1995 | Laura et al. ................. 428/413 |
| 5,589,446 | 12/1996 | Unruh . |
| 5,604,191 | 2/1997 | Unruh . |
| 5,705,463 | 1/1998 | Unruh . |
| 5,843,621 | 12/1998 | Schäfer . |
| 5,863,406 | 1/1999 | Mazzoni et al. . |

* cited by examiner

*Primary Examiner*—Samuel A. Acquah
(74) *Attorney, Agent, or Firm*—Donald J. Breh; Mark W. Croll; John P. O'Brien

(57) ABSTRACT

A water soluble, non-ionic masking agent is used in the manufacture of printed circuit boards. The masking agent masks portions of the circuit board to prevent adhesion of solder, flux and the like. The masking agent includes a water soluble non-ionic binder resin, a cellulosic non-ionic filler, a non-ionic surfactant, at least one non-ionic associative thickener, and deionized water. The masking agent material is readily removed from the circuit board after manufacture and does not render further wash water processing ineffective. The masking agent is non-ionic, and thus does not agglomerate or clump downstream ion-exchange or filtration media.

14 Claims, No Drawings

NON-IONIC CIRCUIT BOARD MASKING AGENT

FIELD OF THE INVENTION

The present invention relates to a temporary masking agent for use in the manufacture of printed circuit boards. More particularly, the present invention relates to a masking agent formed of non-ionic constituents for use in the manufacture of printed circuit boards.

BACKGROUND OF THE INVENTION

Temporary masks are used to provide a coating material when manufacturing printed circuit boards. The masks are used to protect selected areas of the circuit board from the action of, for example, an acid etch, plating, such as electroplating, solder and the like. The mask is a coating which protects a portion of the circuit board during the processing thereof. Essentially, the mask prevents or restricts, for example, solder pickup or flow into those areas that are intended to be protected or free of the solder.

In the manufacture of printed circuit boards, following the application of solder or electroplating, the circuit board must be cleaned in order to properly function. Because of the miniaturization of many of the components that are affixed to circuit boards, it is necessary to maintain extremely high levels of cleanliness and strict standards to which the printed circuit boards are manufactured.

Water is a primary constituent used for cleaning printed circuit boards. In addition, in order to maintain the high standards and levels of cleanliness, the water is ultra-pure. That is, the various contaminants present in well water or other public water sources are first removed from the water prior to its use in the circuit board processing and cleaning systems. In order to prepare the water for use in these processing systems, extreme measures are taken to minimize the level of contaminants in the water. This processing of water can be quite costly and, to this end, it is desirable to maintain as much of the water within the system and to minimize make-up or re-processing in order to maintain the water inventory at an acceptable level and the contamination levels low. In order to maintain the low contaminant levels and high cleanliness standards, while maintaining the water processing costs at an economically feasible level, the water is typically maintained in a closed loop recycle system.

During the manufacturing process, the temporary masking material is washed from the printed circuit boards and removed by various steps of a water wash. After removal of the temporary mask, the water must be filtered and demineralized (e.g., ion-exchange) in order to maintain the high cleanliness standards. Known masking agents materials have ionic components. There is a great tendency for the removed masking materials to collect or agglomerate on the filtering and ion-exchange materials. Because of the ionic nature of these materials, they tend to bind to the ionic demineralization media due to the media's high affinity for the ionic materials. This phenomenon results in quickly loading the ion-exchange media beds, thus, rendering them ineffective.

Accordingly, there exists a need for an effective masking material that does not render further processing ineffective. Most desirably, such a material is non-ionic and, does not agglomerate or clump the ion-exchange or filtration media. Most desirably, such a non-ionic mask extends the life of the circuit board wash solution while maintaining high standards and levels of cleanliness and low contamination levels in the processing water.

SUMMARY OF THE INVENTION

A water soluble, non-ionic masking agent is used in the manufacture of printed circuit boards. The masking agent comprises a water soluble non-ionic binder resin, a cellulosic non-ionic filler, a non-ionic surfactant, at least one non-ionic associative thickener, and deionized water.

Advantageously, the masking agent material does not render further processing, e.g., water purification, ineffective. The masking agent is non-ionic and does not agglomerate or clump downstream ion-exchange or filtration media. The masking agent thus permits extended life of the media used in the circuit board wash process while maintaining high standards and levels of cleanliness and low contamination levels in the processing water.

A preferred non-ionic binder resin is selected from the group consisting of: polyvinyl alcohol, polysaccharides, polyvinyl pyrrolidone, polyethylene oxide, polypropylene oxide, non-ionic water soluble gums, non-ionic water soluble starches, non-ionic water soluble cellulosics and non-ionic water soluble casiens. In a preferred masking agent, the water soluble non-ionic binder resin is polyvinyl alcohol in a concentration of about 55 to about 70 weight percent. Most preferably, the binder resin is present in a concentration of about 62 weight percent.

A preferred cellulosic filler is wood pulp. Preferably, the filler is present in a concentration of about 10 to about 30 weight percent, and most preferably in a concentration of about 12.6 weight percent.

In a preferred masking agent, the non-ionic surfactant is an unsaturated alcohol. More preferred, the unsaturated alcohol is tetramethyl decynediol in a concentration of about 1.0 to about 4.0 weight percent, and most preferably, about 2.0 weight percent.

The non-ionic associative thickener can be a combination of one or more thickeners. More preferred, the thickeners are acrylic emulsions in a concentration of about 2.0 to about 5.0 weight percent; and most preferably, about 3.4 weight percent.

Deionized water is used to make up the remainder of the masking agent and is present in a concentration of about 1.0 weight percent to about 32 weight percent, and a most preferably present in a concentration of about 19.8.

Other features and advantages of the present invention will be apparent from the following detailed description, the accompanying drawings, and the appended claims.

DETAILED DESCRIPTION OF THE PREFERRED EMBODIMENTS

While the present invention is susceptible of embodiment in various forms, there is shown in the drawings and will hereinafter be described a presently preferred embodiment with the understanding that the present disclosure is to be considered an exemplification of the invention and is not intended to limit the invention to the specific embodiment illustrated.

A masking agent in accordance with the present invention is essentially completely water soluble. That is, as it is removed or washed from the substrate that forms the printed circuit board, it dissolves into the water to return to a liquid state. In addition, the present masking agent is non-ionic in character.

Unlike known masking agents that are water soluble, the solubility of the present masking agent is independent of the ionic moieties of the binder resin. Moreover, fillers used in the present masking agent are also non-ionic in character.

Again, this is unlike known water soluble agents that use fillers containing, for example, soluble ionic salts.

The present water soluble, non-ionic masking agent includes a water soluble non-ionic binder resin, a cellulosic non-ionic filler, a non-ionic surfactant, one or more non-ionic associative thickeners and deionized water. In a preferred masking agent, the binder is present is a weight percent of about 55 to about 70 weight percent, the cellulosic filler is present in a weight percent of about 10 to about 30 weight percent, the surfactant is present in a weight percent of about 1.0 to about 3.0 weight percent, the one or more associative thickeners are present in a weight percent of about 2.0 to about 10.0 weight percent, and deionized water is present in a weight percent of about 1.0 to about 32.0 weight percent, making up the remainder of the masking agent to 100 weight percent. As will be recognized by those skilled in the art, the weight percents shown for the masking agent constituents total to 100 weight percent inclusive of the deionized water.

The non-ionic binder resin can be any of a variety of non-ionic water soluble materials. These resins include polysaccharides, polyvinylpyrrolidone, polyethyleneoxide, polypropyleneoxide, non-ionic water soluble gums, starches, cellulosics and casiens. Preferably, the binder is a water soluble non-ionic polyvinyl alcohol.

In a preferred masking agent, the polyvinyl alcohol resin is present in a weight percent of about 55 percent to about 70 percent and most preferably about 62 percent. A known polyvinyl alcohol binder resin is commercially available from Air Products and Chemicals of Allentown, Pa. under the trade name AIRVOL® 21-205.

The cellulosic non-ionic filler is of a type not presently known to be used in masking agents. Unlike known masking agents that typically use clays and the like, the present non-ionic material has a low affinity for deionization or demineralization media used in the closed-loop water processing systems. The present masking agent uses a high purity, powdered, low ash, cellulosic, wood pulp filler. The filler is present in a weight percent of about 10 percent to about 30 percent and most preferably in a weight percent of about 12.6. A known material for use as the filler in the present masking agent is commercially available from Cellulose Filler Factory, Co. of Chestertown, Md. under the trade name TECHNOCEL® 40.

The surfactant, likewise, is of a non-ionic character. The surfactant is an unsaturated alcohol, such as tetramethyl decynediol in ethylene glycol, as represented by $C_{14}H_6O$. It is characterized by a hydrophilic portion in the middle of two hydrophobic groups. Preferably, the surfactant is present in a weight percent of about 1.0 percent to about 4.0 percent and most preferably in a weight percent of about 2.0. One known surfactant is commercially available from Air Products and Chemicals under the trade name SURFYNOL® 104E.

One or more associative thickeners are used in the present masking agent. These thickeners are acrylic emulsions and are preferably present in a weight percent of about 2.0 to about 5.0 weight percent and most preferably about 3.4 weight percent. In a present masking agent, the associative thickeners are ACRYSOL® RM825 and ACRYSOL® 6038A, commercially available from the Rohm & Haas Company of Philadelphia, Pa., and are present in weight percents of about 2.4 and 1.1, respectively.

Deionized water is present in the masking agent in a weight percent of about 1.0 to about 32 percent, and most preferably in a weight percent of about 19.8. The deionized water is used to make up the remainder of the masking agent to 100 weight percent.

EXAMPLE

A masking agent in accordance with the present invention was made using the following constituents:

| Chemical Constituent | Constituent Material Used | Weight Percent |
| --- | --- | --- |
| Binder | AIRVOL® 21–25 | 62.02 |
| Cellulosic Non-ionic Filler | TECHNOCEL® 40 | 12.64 |
| Non-ionic Surfactant | SURFYNOL® 104E | 2.01 |
| Non-ionic Associative Binder 1 | ACRYSOL® RM825 | 2.35 |
| Non-ionic Associative Binder 2 | ACRYSOL® 6038A | 1.11 |
| Deionized Water | — | 19.80 |
| | TOTAL: | 99.93 |

The masking agent was prepared by mixing together the constituents at about room temperature. No special procedures were followed other than accurately weighing the constituents as they were added to the masking agent.

It was observed that a masking agent prepared in accordance with the above binder or resin was essentially completely water soluble. The masking agent was observed to have been completely removed from a substrate material typically used for the manufacture of printed circuit boards. The masking agent was subsequently processed in an exemplary typical arrangement for a closed-loop water processing system, that included a filter and a demineralizer or deionizer unit. It was observed that the masking agent and solution was properly filtered and deionized and did not cake or clump the filter or demineralizer media.

From the foregoing it will be observed that numerous modifications and variations can be effectuated without departing from the true spirit and scope of the novel concepts of the present invention. It is to be understood that no limitation with respect to the specific embodiments illustrated is intended or should be inferred. The disclosure is intended to cover by the appended claims all such modifications as fall within the scope of the claims.

What is claimed is:

1. A water soluble, non-ionic masking agent for use in the manufacture of printed circuit boards, comprising:
   a water soluble non-ionic binder resin;
   a cellulosic non-ionic filler;
   a non-ionic surfactant;
   a non-ionic associative thickener; and
   deionized water.

2. The water soluble non-ionic masking agent in accordance with claim 1 wherein, the water soluble non-ionic binder resin is selected from the group consisting of: polyvinyl alcohol, polysaccharides, polyvinylpyrrolidone, polyethyleneoxide, polypropyleneoxide, non-ionic water soluble gums, non-ionic water soluble starches, non-ionic water soluble cellulosics and non-ionic water soluble casiens.

3. The water soluble non-ionic masking agent in accordance with claim 2 wherein, the water soluble non-ionic binder resin is polyvinyl alcohol.

4. The water soluble non-ionic masking agent in accordance with claim 1 wherein, the non-ionic cellulosic filler is wood pulp.

5. The water soluble non-ionic masking agent in accordance with claim 1 wherein, the non-ionic surfactant is an unsaturated alcohol.

6. The water soluble non-ionic masking agent in accordance with claim 5 wherein the unsaturated alcohol is tetramethyl decynediol.

7. The water soluble non-ionic masking agent in accordance with claim 1 wherein, the non-ionic associative thickener is an acrylic emulsion.

8. The water soluble non-ionic masking agent in accordance with claim 1 wherein, the water soluble non-ionic resin in present in a weight percent of about 55 to about 70 percent, the non-ionic filler is present in a weight percent of about 10 to about 30 percent, the non-ionic surfactant is present in a weight percent of about 1.0 to about 4.0 percent, the non-ionic associative thickener is present in a weight percent of about 2.0 to about 5.0 percent, and deionized water is present in a weight percent of about 1.0 to about 32 percent.

9. The water soluble non-ionic masking agent in accordance with claim 8 wherein, the non-ionic associative thickener is a mixture of a plurality of thickeners.

10. A water soluble, non-ionic masking agent for use in manufacturing printed circuit boards consisting essentially of:

a water soluble, non-ionic binder in a weight percent of about 55 to about 70 percent;

a non-ionic filler in a weight percent of about 10 to about 30 percent;

a non-ionic surfactant in a weight percent of about 1.0 to about 4.0 percent;

a non-ionic associative thickener in a weight percent of about 2.0 to about 10 percent; and deionized water in a weight percent of about 1.0 to about 32 percent.

11. The water soluble non-ionic masking agent in accordance with claim 10 wherein, the binder is polyvinyl alcohol in a weight percent of about 62 percent.

12. The water soluble non-ionic masking agent in accordance with claim 10 wherein, the non-ionic filler is present in a weight percent of about 12.6 percent.

13. The water soluble non-ionic masking agent in accordance with claim 10 wherein, the non-ionic surfactant is present in a weight percent of about 2.0 percent.

14. The water soluble non-ionic masking agent in accordance with claim 10 wherein, the non-ionic associative thickener is a mixture of a plurality of thickeners in a weight percent of about 3.4 percent.

* * * * *